United States Patent [19]

Andrews

[11] 4,215,761

[45] Aug. 5, 1980

[54] BASS SOUND PROJECTION SYSTEMS

[76] Inventor: Anthony J. Andrews, Ridge Farm, Rusper Rd., Capel, Surrey, England

[21] Appl. No.: 957,308

[22] Filed: Nov. 2, 1978

[30] Foreign Application Priority Data

Nov. 4, 1977 [GB] United Kingdom ............... 45927/77

[51] Int. Cl.$^2$ ............................................ H05K 5/00

[52] U.S. Cl. .................................... 181/152; 181/156; 181/160; 181/199

[58] Field of Search ................................ 181/144–156, 181/159, 160, 185, 191, 199; 179/1 E, 115.5 H

[56] References Cited

U.S. PATENT DOCUMENTS

| | | | |
|---|---|---|---|
| 1,878,088 | 9/1932 | Zwikker | 181/159 |
| 1,901,388 | 3/1933 | Wolff | 179/1 E |
| 1,943,499 | 1/1934 | Williams | 181/159 |
| 2,759,553 | 8/1956 | Bosley | 181/145 |
| 2,819,772 | 1/1958 | Bryan | 181/145 |
| 2,900,040 | 8/1959 | Novak | 181/152 |
| 3,065,816 | 11/1962 | Ranger | 181/147 |
| 4,138,594 | 2/1979 | Klipsch | 181/152 |

FOREIGN PATENT DOCUMENTS

| | | | |
|---|---|---|---|
| 89606 | 8/1960 | Denmark | 181/152 |

*Primary Examiner*—L. T. Hix
*Assistant Examiner*—Benjamin R. Fuller
*Attorney, Agent, or Firm*—Gottlieb, Rackman & Reisman

[57] ABSTRACT

A bass sound projection system comprises a cabinet containing at least one bass loudspeaker operating into a sound channel. The sound channel converges forwardly, relative to the direction of propagation of sound waves, of the loudspeaker to a throat and then diverges forwardly, relative to the direction of propagation of sound waves, of the throat to an acoustically open front end of the cabinet. The system may include a further bass loudspeaker and sound channel arranged as a mirror image of the first bass loudspeaker and sound channel, and the or each sound channel may be folded.

3 Claims, 2 Drawing Figures

BASS SOUND PROJECTION SYSTEMS

BACKGROUND OF THE INVENTION

1. Field of the Invention

This invention relates to bass sound projections systems. By "bass sound" is meant sound having a frequency of 20 hertz (Hz) to 200 Hz.

2. Description of the Prior Art

Prior art systems require an enclosure of very large volume in order to produce low frequency or bass sound. Also, horn loading of the loudspeakers has generally been adopted in order to project the sound over distances. However, a disadvantage of horn loading is that the sound produced, particularly at a distance from the system, tends to lack definition. Indeed, the sound has been subjectively described as woolly, boomy and incoherent.

SUMMARY OF THE INVENTION

It is an object of the invention to provide a bass sound projection system of reduced size with respect to the prior art systems and of improved sound quality.

According to the invention there is provided a bass sound projection system comprising a cabinet containing at least one bass loudspeaker operating into a sound channel which converges forwardly (relative to the direction of propagation of sound waves) of the loudspeaker to a throat and diverges forwardly (relative to the direction of propagation of sound waves) of the throat to an acoustically open front end of the cabinet.

The sound system according to the invention provides better coupling of the loudspeaker cone to the air and the "accelerating effect" of the throat improves the definition, and hence the quality, of the sound. Further, the increased pressure in front of the loudspeaker allows the volume of the enclosure behind the loudspeaker to be greatly reduced. For instance, well defined bass sound may be produced from a system according to the invention which is approximately one third the size of a similar prior art system.

BRIEF DESCRIPTION OF THE DRAWINGS

The invention will be described by way of example with reference to the accompanying drawings, wherein.

DESCRIPTION OF THE PREFERRED EMBODIMENT

Figure 1:
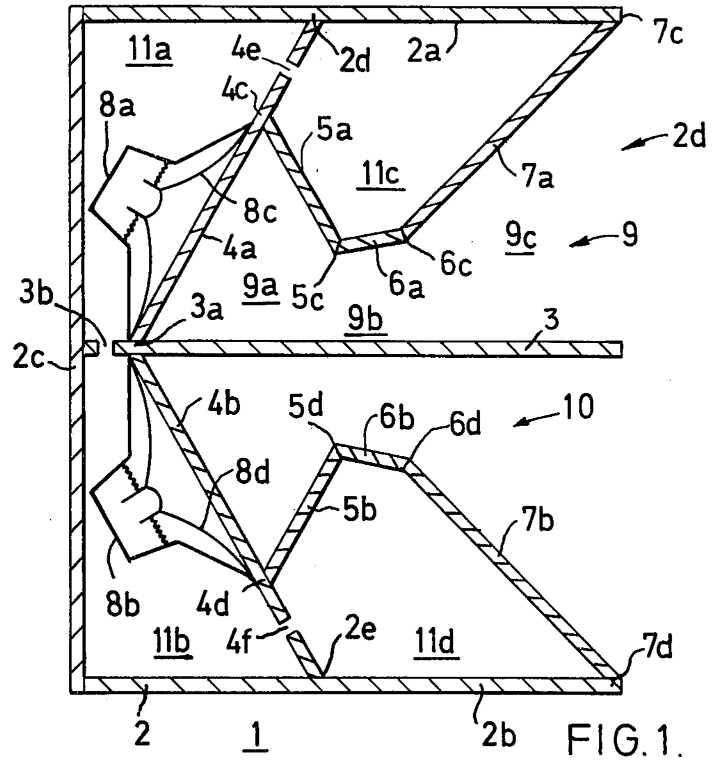
FIG. 1 is a diagrammatic plan view of a base sound projection system embodying the invention.

Referring to FIG. 1, there is illustrated therein a bass sound projection system 1 comprising a rectangular cabinet 2 having outer side walls 2*a* and 2*b*, an outer rear wall 2*c* and horizontal top and bottom walls (not shown). A vertical central partition 3 extends forwardly from the rear wall 2*c*, inside the cabinet 2, and divides the interior of the cabinet 2 into two equal halves. Two angled partitions 4*a* and 4*b* diverge forwardly from 3*a* on the partition 3 to 2*d* and 2*e* respectively on the side walls 2*a* and 2*b*. Two more partitions 5*a* and 5*b* respectively converge forwardly from 4*c* and 4*d* on partitions 4*a* and 4*b* to 5*c* and 5*d* as shown. Two more partitions 6*a* and 6*b* respectively slightly diverge forwardly from 5*c* and 5*d* to 6*c* and 6*d*, whilst two further partitions 7*a* and 7*b* respectively diverge forwardly from 6*c* and 6*d* to 7*c* and 7*d*, at the front ends of walls 2*a* and 2*b*.

Two bass frequency loudspeakers 8*a* and 8*b*, each respectively having a cone diaphragm 8*c*, 8*d*, are mounted respectively over the partitions 4*a* and 4*b* as shown, and are hermetically sealed thereto.

The partitions 3, 4*a*, 5*a*, 6*a* and 7*a* in combination define a first sound channel 9 into which the loudspeaker 8*a* operates. The sound channel 9 comprises a rear portion 9*a* converging forwardly (relative to the direction of propagation of sound waves, that is, generally forwardly of the cabinet) to a throat 9*b* and a front portion 9*c* diverging forwardly (relative to the direction of propagation of the sound waves, likewise generally forwardly of the cabinet) of the throat 9*b* to an acoustically open front end 2*d* of the cabinet.

The partitions 3, 4*b*, 5*b*, 6*b* and 7*b* in combination define a second sound channel 10 into which the loudspeaker 8*b* operates. The sound channel 10 is a mirror image of the sound channel 9. Since the partition 3 is planar, each of the sound channels 9 and 10 is bent or folded at the throat.

The two loudspeakers 8*a* and 8*b* are on opposite sides of a central plane, contained within the partition 3, separating the partitions 5*a* and 5*b* from each other and also separating the partitions 7*a* and 7*b* from each other. As shown, the two loudspeakers 8*a* and 8*b* are angled inwardly towards the partition 3, so that each loudspeaker 8*a*, 8*b* directly faces the throat of its associated sound channel 9, 10.

There is a single common enclosed volume "behind" the loudspeakers 8*a* and 8*b*. This single common enclosed volume is made up of four parts 11*a*, 11*b*, 11*c* and 11*d*, interconnected by ports such as 3*b* in partition 3 and 4*e* and 4*f* respectively in partitions 4*a* and 4*b*. It will be seen from the drawing that parts 11*c* and 11*d* of the enclosed volume are laterally outside of the sound channels 9 and 10 and extend as far forwardly as the front of the cabinet, outside of the two partitions 7*a* and 7*b*.

It has been found that a bass sound projection system, made as described above and illustrated in the drawing, is very efficient at projecting bass sound, although the reasons for this are not fully understood. It is believed that an important reason for the efficacy of the illustrated system is the fact that the sound channels 9 and 10 each converge forwardly from the loudspeakers towards the respective throat and then diverge forwardly from the throat to the front of the channel, compressing the (bass frequency) sound waves up to the throat and causing acceleration allied with pressure reduction of the sound waves in the throat. However, as mentioned previously, the effect is not fully understood and this may accordingly not be a correct explanation of what takes place.

Because all of the partitions 4*a*, 4*b*, 5*a*, 5*b*, 6*a*, 6*b*, 7*a* and 7*b* are straight sided, they can be made of three quarter inch thick plywood.

The top and bottom, neither of which is shown, of the cabinet 2 are planar and are parallel to the plane of the drawing, and define top and bottom planar sides of the sound channels 9 and 10. The cross-section of the illustrated system is the same in any horizontal plane, apart (obviously) from the cross-sections of the loudspeakers 8*a* and 8*b*, that is to say, the partitions are all vertical.

If desired, a second pair of speakers, not shown, may be mounted in the partitions 4*a* and 4*b*, directly above or below the loudspeakers 8*a* and 8*b*, so that the system has four loudspeakers instead of just two loudspeakers.

Similarly, a third pair of loudspeakers may be added, and so forth.

The partition 3 may be dispensed with (although preferred) so that the speakers 8*a* and 8*b* operate into a common sound channel comprising a portion defined by partitions 5*a* and 5*b* converging from loudspeaker 8*a* and 8*b* towards a throat defined by partitions 6*a* and 6*b* and comprising a portion defined by partitions 7*a* and 7*b* diverging forwardly from the throat to the front end 2*d* of the cabinet. In this case the sound channel is not folded because the central plane defines a plane of symmetry.

Figure 2:
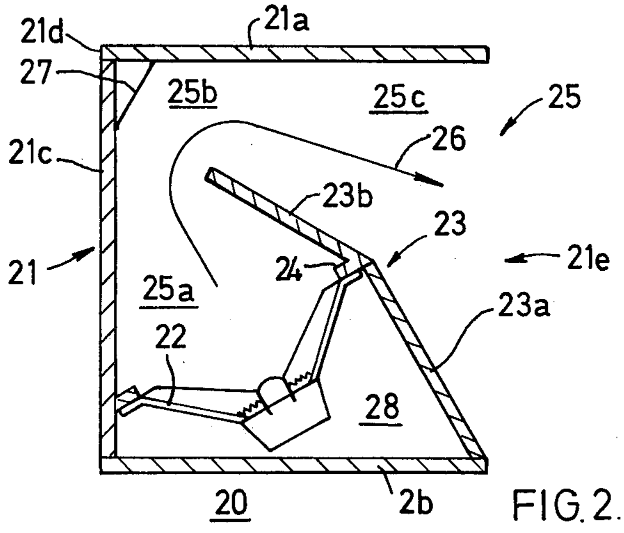
FIG. 2 is a diagrammatic plan view of another base sound projection system embodying the invention.

Refferring to FIG. 2, the bass sound projection system 20 illustrated therein comprises a cabinet 21 in which there is mounted a single bass frequency loudspeaker 22 as shown having a cone diaphragm. The cabinet 21 is rectangular and has vertical side walls 21*a* and 21*b*, a vertical rear wall 21*c* and horizontal top and bottom walls (not shown). A vertical partition 23 comprises a forward portion 23*a* and a rearward portion 23*b* angled as shown relative to the side walls 21*a* and 21*b*.

The loudspeaker 22 is mounted in a vertical partition 24 as shown and operates into a rearward portion 25*a* of a sound channel 25. This rearward sound channel portion 25*a* is defined by rear wall 21*c* and partition portion 23*b* and converges forwardly (relative to the direction of sound propagation as shown by the arrow 26, ie towards the rear corner 21*d* of the cabinet) from loudspeaker 22 to a throat 25*b*. The sound channel 26 is folded at the throat 25*b* as indicated by the fold or bend in the arrow 26. A forward portion 25*c* of sound channel 25 is defined by side wall 21*a* and partition 23 and diverges forwardly (relative to the direction of sound propagation as shown by arrow 26, ie generally forwardly of the cabinet) from the throat 25*b* towards an acoustically open front end 21*e* of the cabinet. A small corner fillet 27 at the corner 21*d* helps to reflect the sound at the throat 25*b*. There is an enclosed volume 28 "behind" the loudspeaker 22, enclosed by side wall 21*b*, partitions 23*a* and 24 and part of rear wall 21*c*.

I claim:

1. A bass sound projection system comprising a cabinet having an acoustically open front end, a bass loudspeaker, and a sound channel having a throat, wherein said cabinet contains said bass loudspeaker which operates into said sound channel, said sound channel converges forwardly of said loudspeaker relative to the direction of propagation of sound waves to said throat and then diverges forwardly of said throat relative to the direction of propagation of sound waves to said acoustically open front end of said cabinet, said forwardly converging portion of said sound channel converges symmetrically with respect to the axis of said loudspeaker with a relatively gentle convergence, and said forwardly diverging portion of said sound channel is folded back upon said forwardly converging portion and shares a common partition therewith.

2. A system as set forth in claim 1, wherein said cabinet is cuboidal and said open front end comprises the whole of one face of the cabinet.

3. A system as set forth in claim 2, wherein said cabinet includes a small enclosed chamber behind said loudspeaker equal in width to said sound channel.

* * * * *